(12) United States Patent
Zhang et al.

(10) Patent No.: US 8,853,764 B1
(45) Date of Patent: Oct. 7, 2014

(54) INTEGRATION OF LOW $RDS_{on}$ LDMOS WITH HIGH SHEET RESISTANCE POLY RESISTOR

(71) Applicants: Guowei Zhang, Singapore (SG); Deyan Chen, Singapore (SG)

(72) Inventors: Guowei Zhang, Singapore (SG); Deyan Chen, Singapore (SG)

(73) Assignee: GLOBALFOUNDRIES Singapore Pte. Ltd, Singapore (SG)

( * ) Notice: Subject to any disclaimer, the term of this patent is extended or adjusted under 35 U.S.C. 154(b) by 0 days.

(21) Appl. No.: 13/832,682

(22) Filed: Mar. 15, 2013

(51) Int. Cl.
- *H01L 29/788* (2006.01)
- *H01L 21/336* (2006.01)
- *H01L 29/66* (2006.01)
- *H01L 29/78* (2006.01)

(52) U.S. Cl.
CPC ...... *H01L 29/7817* (2013.01); *H01L 29/66681* (2013.01)
USPC .......................................... 257/316; 438/259

(58) Field of Classification Search
CPC .................. H01L 29/66681; H01L 29/66613; H01L 29/7816; H01L 2924/19043
USPC .......................................... 438/238; 257/316
See application file for complete search history.

(56) References Cited

U.S. PATENT DOCUMENTS

| | | | | |
|---|---|---|---|---|
| 7,842,967 B2 * | 11/2010 | Ohtsuka et al. | ............... | 257/121 |
| 7,884,440 B2 * | 2/2011 | Chung | ........................... | 257/499 |
| 8,101,479 B2 * | 1/2012 | Parker et al. | .................. | 438/231 |

* cited by examiner

*Primary Examiner* — William D Coleman
(74) *Attorney, Agent, or Firm* — Ditthavong & Steiner, P.C.

(57) ABSTRACT

A method for forming a low $Rds_{on}$ LDNMOS and a high sheet resistance poly resistor and the resulting device are provided. Embodiments include forming first, second, and third STI regions in a substrate; forming a P-well in the substrate around the first STI region with a first mask; forming an N-drift region in the substrate between the P-well and the third STI region with the first mask; forming a dielectric layer over the substrate; forming a poly-silicon layer over the dielectric layer; performing an N-drain implant between the second and third STI regions with a second mask; performing a resistance adjustment implant in, but not through, the poly-silicon layer with the second mask; and patterning the poly-silicon and dielectric layers subsequent to performing the resistance adjustment implant to form a gate stack and a poly resistor, the poly resistor being formed over the third STI region and laterally separated from the gate stack.

20 Claims, 6 Drawing Sheets

INTEGRATION OF LOW RDS$_{on}$ LDMOS WITH HIGH SHEET RESISTANCE POLY RESISTOR

TECHNICAL FIELD

The present disclosure relates to integration of low on stage resistance (Rds$_{on}$) laterally diffused metal oxide semiconductor (LDMOS) devices with widely used high sheet resistance polysilicon (poly) resistors. The present disclosure is particularly applicable to high voltage devices.

BACKGROUND

LDMOS devices and high sheet resistance poly resistors have been widely used in power management and high voltage driver circuit design. As low Rds$_{on}$ is generally preferred for LDMOS devices, N-type LDMOS (LDNMOS) devices have been most commonly used due to their Rds$_{on}$ being lower than P-type LDMOS (LDPMOS) devices since electron mobility is higher than hole mobility. The sheet resistance of the high sheet resistance poly used for the resistors is normally 1 kilo ohm (KΩ)/square (sq) or 2 KΩ/sq and a dedicated mask is used for the poly implant to adjust the resistance. A separate mask is then used for the LDMOS drift region implant and this implant is generally done before the gate oxide layer is formed.

To reduce the Rds$_{on}$, additional doping has often been applied to the drain side of a substrate to reduce the connection resistance, and it does not degrade the device breakdown voltage as it is far away from the channel. Moreover, to reduce integration costs, standard core device N-wells are often used. However, the disadvantage of using a standard N-well is that low dose shallow threshold voltage (vt) implants are required to meet core PMOS device performance targets, and the low dosage is not helpful to reduce LDNMOS drain resistance. Further, to reduce latchup issues, standard N-well formation normally requires high doping concentrations, e.g., greater than 1e13/centimeter squared (cm$^2$), which generally is too high for LDNMOS drift region doses, e.g., less than 1e13/cm$^2$. In addition, a standard N-well doping profile is not fully optimized for lower Rds$_{on}$ LDNMOS performance. Further, while a dedicated mask for the additional drain implant is helpful for optimizing the LDNMOS Rds$_{on}$, the necessity of an additional mask is not cost effective.

A need therefore exists for methodology enabling integration of a low Rds$_{on}$ LDNMOS and a high sheet resistance poly resistor, without requiring additional masks, and the resulting device.

SUMMARY

An aspect of the present disclosure is a method of forming a low Rds$_{on}$ LDNMOS and a high sheet resistance poly resistor with the same mask.

Another aspect of the present disclosure is a device including a low Rds$_{on}$ LDNMOS and a high sheet resistance poly resistor device formed with the same mask.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first, second, and third shallow trench isolation (STI) regions in a substrate; forming a P-well in the substrate around the first STI region with a first mask; forming an N-drift region in the substrate between the P-well and the third STI region with a second mask; forming a dielectric layer over the substrate; forming a poly-silicon layer over the dielectric layer; performing an N-drain implant between the second and third STI regions with a third mask; performing a resistance adjustment implant in, but not through, the poly-silicon layer with the third mask; and patterning the poly-silicon and dielectric layers subsequent to performing the resistance adjustment implant to form a gate stack and a poly resistor, the poly resistor being formed over the third STI region and laterally separated from the gate stack.

Aspects of the present disclosure include performing the N-drain implant at an energy of 300 to 2000 KeV and at a dose of 1e12 to 1e13 ion/cm$^2$. Other aspects include performing the resistance adjustment implant at an energy of 0.5 to 20 KeV and at a dose of 1e14 to 1e15 ion/cm$^2$. Further aspects include forming the dielectric layer from a gate oxide. Additional aspects include forming a lightly doped drain (LDD) region using a fourth mask, subsequent to patterning the poly-silicon and dielectric layers. Another aspect includes forming spacers on opposite side surfaces of the gate stack and the poly resistor and forming first and second n+ regions using a fifth mask in the P-well, adjacent to the first STI region, and in the N-drain implant region between the second and third STI regions, respectively, subsequent to forming the LDD region. Other aspects include forming a salicidation block on top of the poly resistor and forming silicide over the first and second n+ regions, the gate stack, and on both sides of the salicidation block on the poly resistor, subsequent to forming the n+ regions.

Another aspect of the present disclosure is a method including: forming first, second, and third STI regions in a substrate; forming first, second, and third P-wells in the substrate with a first mask; forming a dielectric layer over the substrate; forming a poly-silicon layer over the dielectric layer; performing an N-drift implant with a second mask to form first and second N-drift regions adjacent to and between the first and second P-wells and the second and third P-wells, respectively; performing a resistance adjustment implant with the second mask in, but not through, the poly-silicon layer; and patterning the poly-silicon and dielectric layers to form a gate stack and a poly resistor, the poly resistor being formed over the third STI region and laterally separated from the gate stack.

Aspects include performing the N-drift implant at an energy of 300 to 2000 KeV and at a dose of 1e12 to 1e13 ion/cm$^2$. Other aspects include performing the resistance adjustment implant at an energy of 0.5 to 20 KeV and at a dose of 1e14 to 1e15 ion/cm$^2$. Further aspects include forming the dielectric layer from a gate oxide. Additional aspects include forming a LDD region using a third mask subsequent to patterning the poly-silicon and dielectric layers. Another aspect includes forming spacers on opposite side surfaces of the gate stack and the poly resistor; and forming first and second n+ regions using a fourth mask in the P-well, adjacent to the first STI region, and in the first N-drain implant region between the second and third STI regions, respectively, subsequent to forming the LDD region. Other aspects include forming a salicidation block on top of the high sheet resistance poly resistor; and forming silicide on top of the first and second n+ regions, the gate stack, and on both sides of the salicidation block on the poly resistor, subsequent to forming the n+ regions.

Another aspect of the present disclosure is a device including: a semiconductor substrate; first, second, and third STI regions in the semiconductor substrate; a P-well, around and adjacent to the first STI; an N-drift region, between the P-well and the third STI region; first and second n+ regions; a gate stack and a poly resistor on the substrate, each having spacers on opposite side surfaces, the gate stack formed between the first and second STI regions and the poly resistor formed over the third STI region; a salicidation block on top of the poly resistor; and a silicide formed over the first and second n+ regions, the gate stack, and on the poly resistor at opposite sides of the salicidation block.

Aspects include an N-drain implant region in the N-drift region between the second and third STI regions. Other aspects include second and third P-wells below the third STI region, at opposite sides of the third STI region. Further aspects include a second N-drift region between the second and third P-wells. Additional aspects include the gate stack and the poly resistor formed of a poly-silicon layer over a gate oxide layer. Another aspect includes the poly resistor implanted with a dopant implanted at an energy of 0.5 to 20 KeV and at a dose of 1e14 to 1e15 ion/cm$^2$.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of requiring a dedicated mask for forming a high sheet resistance poly resistor and a separate mask for implanting a LDMOS drift region attendant upon forming an LDNMOS with a high sheet resistance poly resistor. The present disclosure also addresses and solves the current problems of latchup and a dedicated mask for additional drain implant attendant upon forming a low Rds$_{on}$ LDMOS with a standard N-well and a high sheet resistance poly resistor.

Methodology in accordance with embodiments of the present disclosure includes forming first, second, and third STI regions in a substrate. A dielectric layer is formed over the substrate. A P-well is formed in the substrate around the first STI region with a first mask. An N-drift region is formed in the substrate between the P-well and the third STI region with a second mask. A poly-silicon layer is formed over the dielectric layer. An N-drain implant is performed between the second and third STI regions with a third mask. A resistance adjustment implant is performed in, but not through, the poly-silicon layer with the third mask. The poly-silicon and dielectric layers are patterned subsequent to performing the resistance adjustment implant to form a gate stack and a poly resistor, the poly resistor being formed over the third STI region and laterally separated from the gate stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
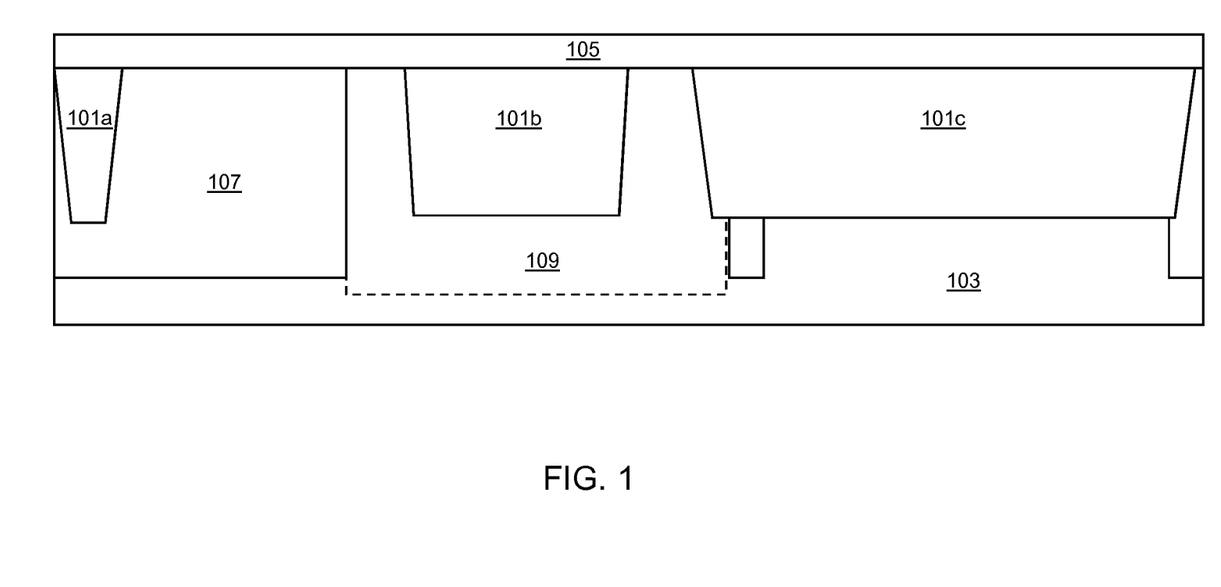
FIGS. 1 through 3 schematically illustrate a process flow for forming a low Rds$_{on}$ LDNMOS and a high sheet resistance poly resistor, in accordance with an exemplary embodiment of the present disclosure.
Figure 2:
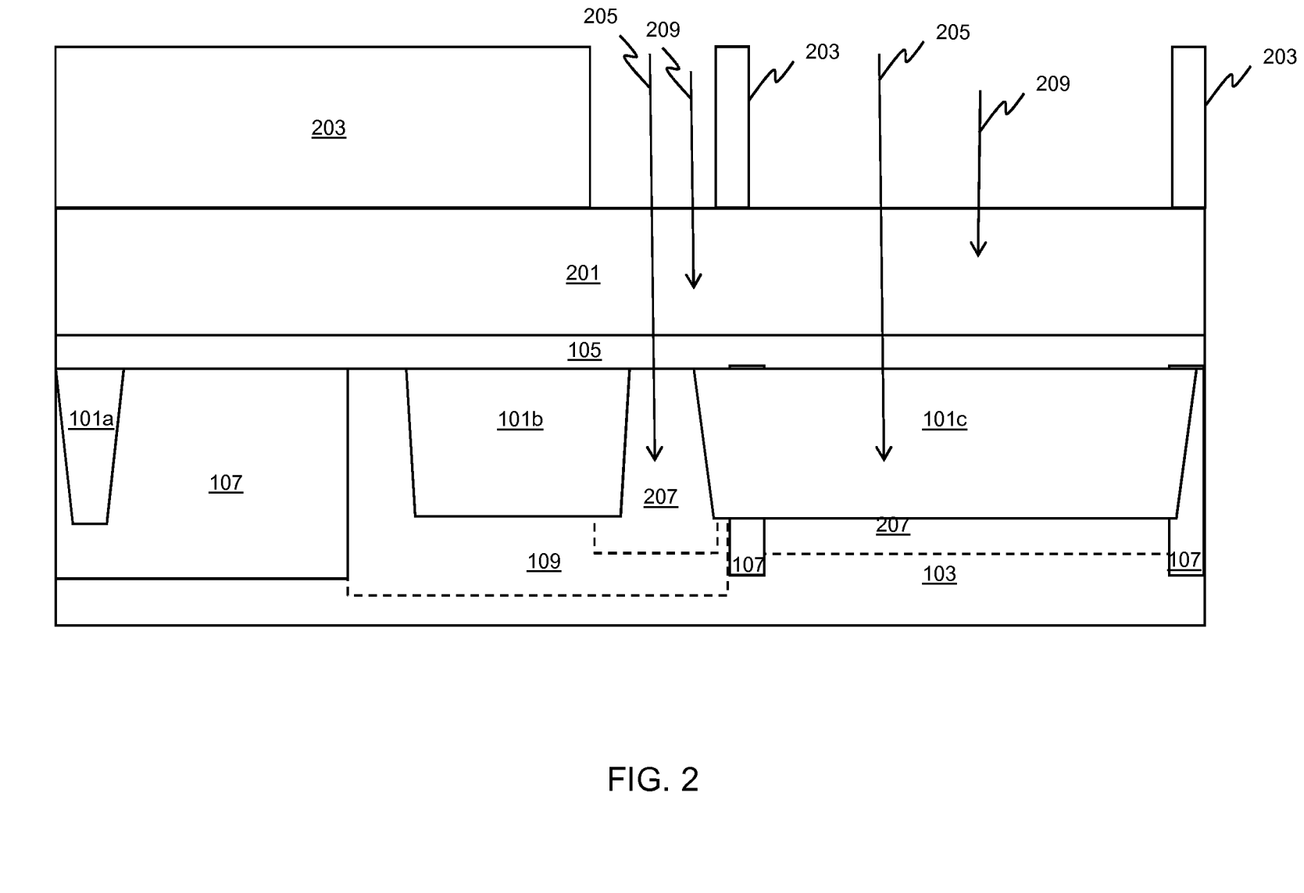
Figure 3:
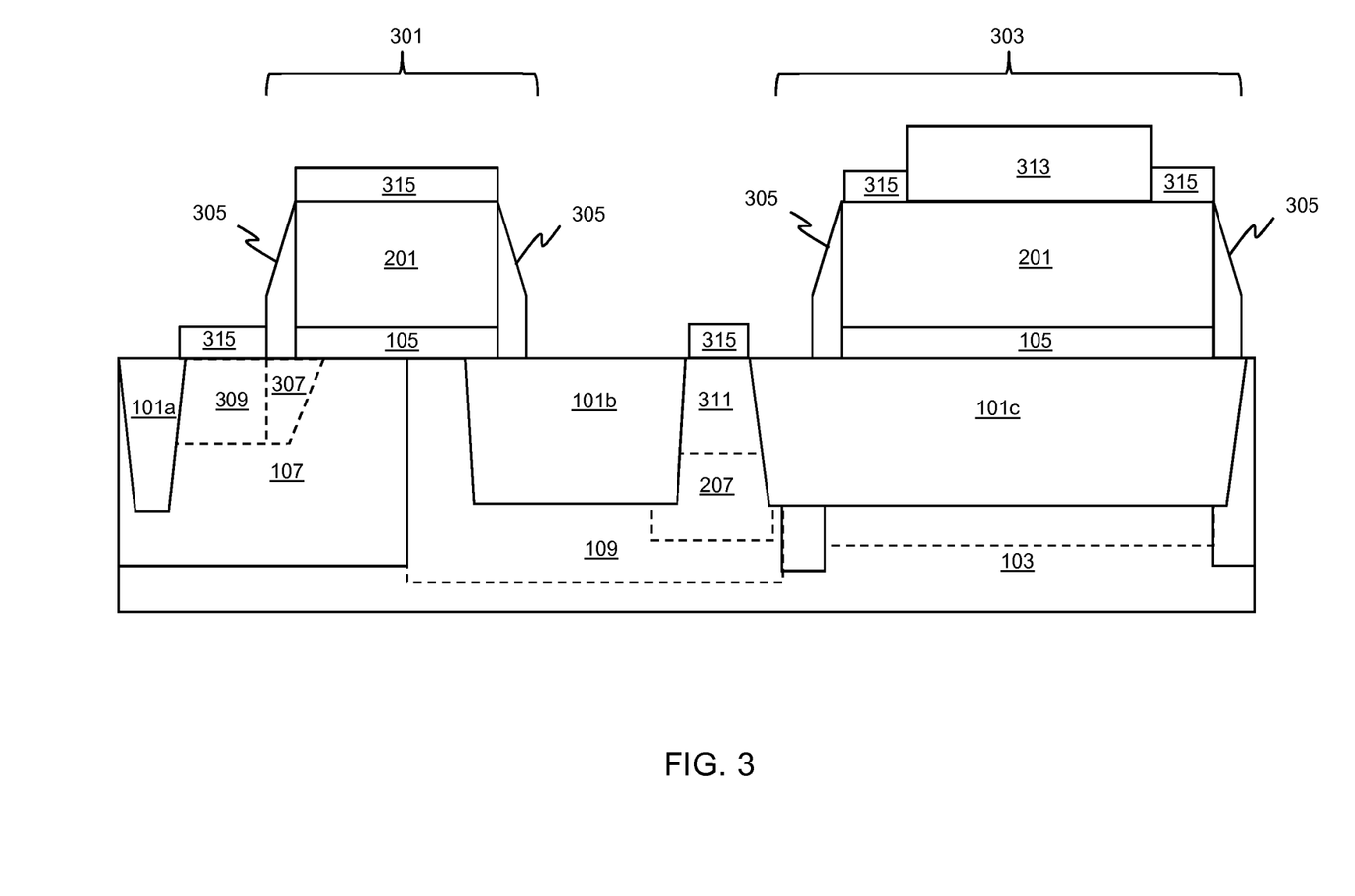

FIGS. 1 through 3 schematically illustrate a process flow for forming a low Rds$_{on}$ LDNMOS and a high sheet resistance poly resistor, in accordance with an exemplary embodiment of the present disclosure. Adverting to FIG. 1, first, second, and third STI regions 101a, 101b, and 101c are formed in a substrate 103. Thereafter, a P-well 107 is formed around the first STI region 101a with a first mask (not shown for illustrative convenience). With a second mask (not shown for illustrative convenience), an N-drift region 109 is formed in the substrate 103 between the P-well 107 and the third STI region 101c. Then, a dielectric layer 105, e.g., a gate oxide, is then formed over the substrate 103.

Next, a poly-silicon layer 201 is formed over the dielectric layer 105 as illustrated in the FIG. 2. A third mask 203 is then formed over the poly-silicon layer 201 within openings to the N-drift region 109 (between the second and third STI regions) and the third STI region 101c. Using the third mask 203, an N-drain implant 205 is performed in the region 207, between the second and third STI regions 101b and 101c, respectively, at an energy of 300 to 2000 KeV and at a dose of 1e12 to 1e13 ion/cm$^2$. The N-drain implant may have multiple steps. The energy for the implant is high to insure the implant goes through the poly-silicon layer 201, and the energy and dosage of the N-drain implant 205 are optimized to have lower Rds$_{on}$ LDNMOS. Although some of the N-drain implant 205 goes into STI region 101c, it is isolated from the LDMOS and resistor, so it does not affect the function of the final LDNMOS or the final poly resistor. Thereafter, using the same third mask 203, a low energy, high dosage, resistance adjustment implant 209 is performed in, but not through, the poly-silicon layer 201 at an energy of 0.5 to 20 KeV and at a dose of 1e14 to 1e15 ion/cm$^2$. More specifically, the energy and dosage of the resistance adjustment implant 209 are selected to adjust the poly sheet resistance of the poly-silicon layer 201 to meet a particular sheet resistance target, while not passing through the poly-silicon.

Adverting to FIG. 3, after the resistance adjustment implant 209, the third mask 203 is removed. Dielectric layer 105 and the poly-silicon layer 201 are patterned to form a gate stack 301 and a poly resistor 303, the poly resistor 303 being formed over the third STI 101c and laterally separated from the gate stack 301. Subsequently, a lightly doped drain region 307 is formed using a fourth mask (not shown for illustrative convenience). Spacers 305 are then formed on opposite side surfaces of each of the gate stack 301 and the poly resistor 303. Thereafter, first and second n+ regions 309 and 311 are formed using a fifth mask (also not shown for illustrative convenience). The first n+ region 309 is formed in the P-well 107, adjacent to the first STI region 101a, and the second n+ region 311 is formed in the N-drain implant region 207 between the second and third STI regions 101b and 101c. Next, a salicidation block 313 is formed on top of the poly resistor 303 and silicides 315 are then formed over the first and second n+ regions 309 and 311, the gate stack 301, and on the poly resistor on both sides of the salicidation block 313. Standard back-end-of-line (BEOL) processing may then proceed.

TCAD results show a 30% improvement on linear current and a 20% improvement on $Rds_{on}$. For example, a normal device without an additional drain implant may have a linear current of 10 microamp ($\mu$A)/micrometer ($\mu$m), a $Rds_{on}$ of 30 milliohms (m$\Omega$)^millimeter squared (mm$^2$), and a breakdown voltage of 38 volts (V). In contrast, a similar device formed with a dedicated mask for additional drain implant, in accordance with an exemplary embodiment of the present disclosure, has a linear current of 13 $\mu$A/$\mu$m, a $Rds_{on}$ of 24 m$\Omega$^mm$^2$, and a breakdown voltage of 38 V.

Figure 4:
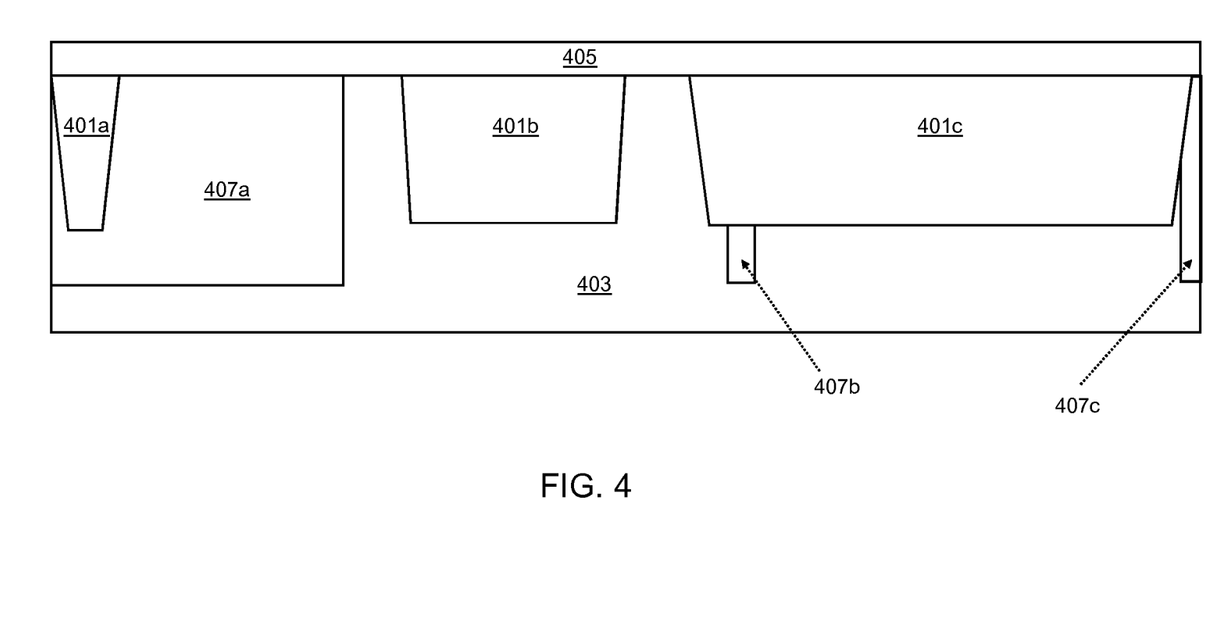
FIGS. 4 through 6 schematically illustrate a process flow for forming an LDNMOS and a high sheet resistance poly resistor, in accordance with another exemplary embodiment of the present disclosure.
Figure 5:
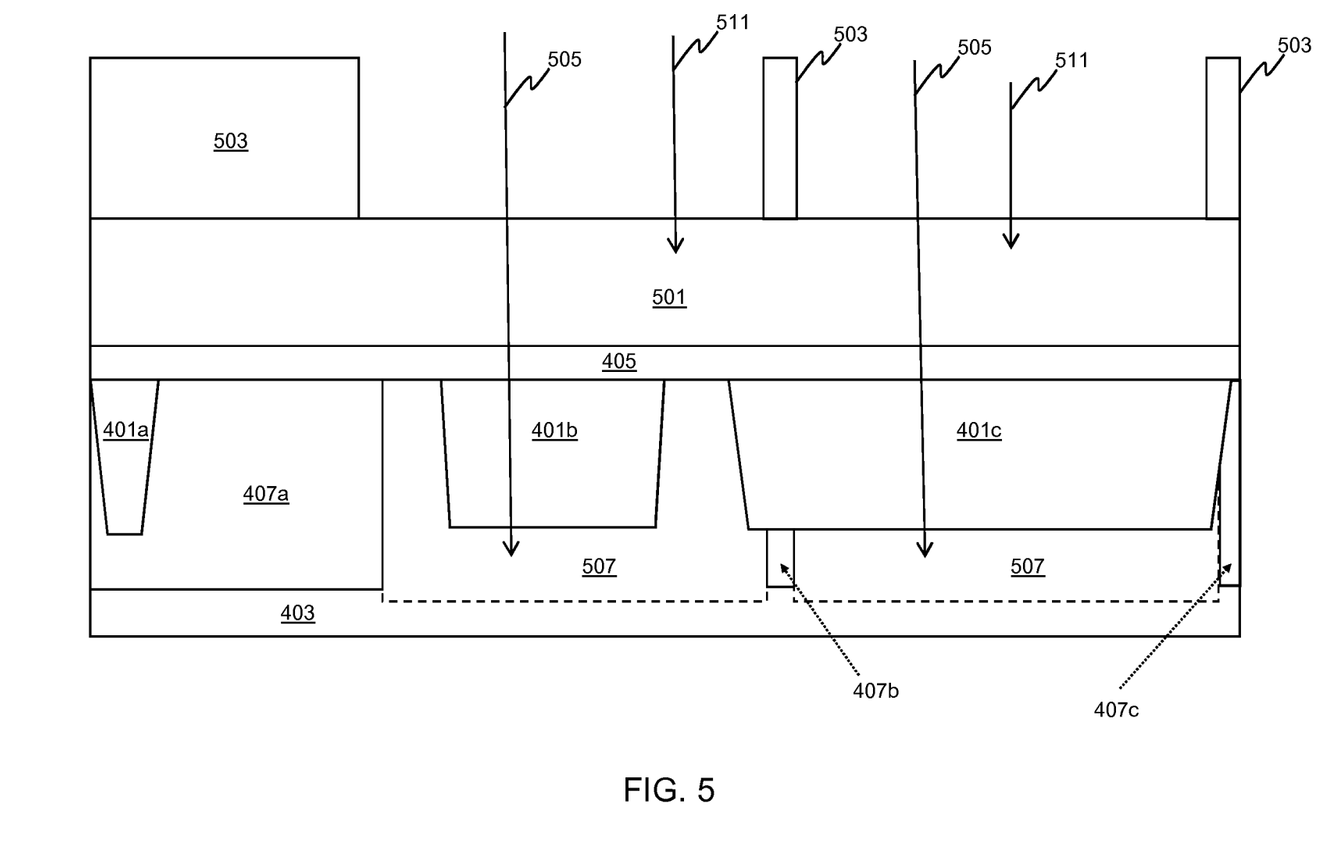
Figure 6:
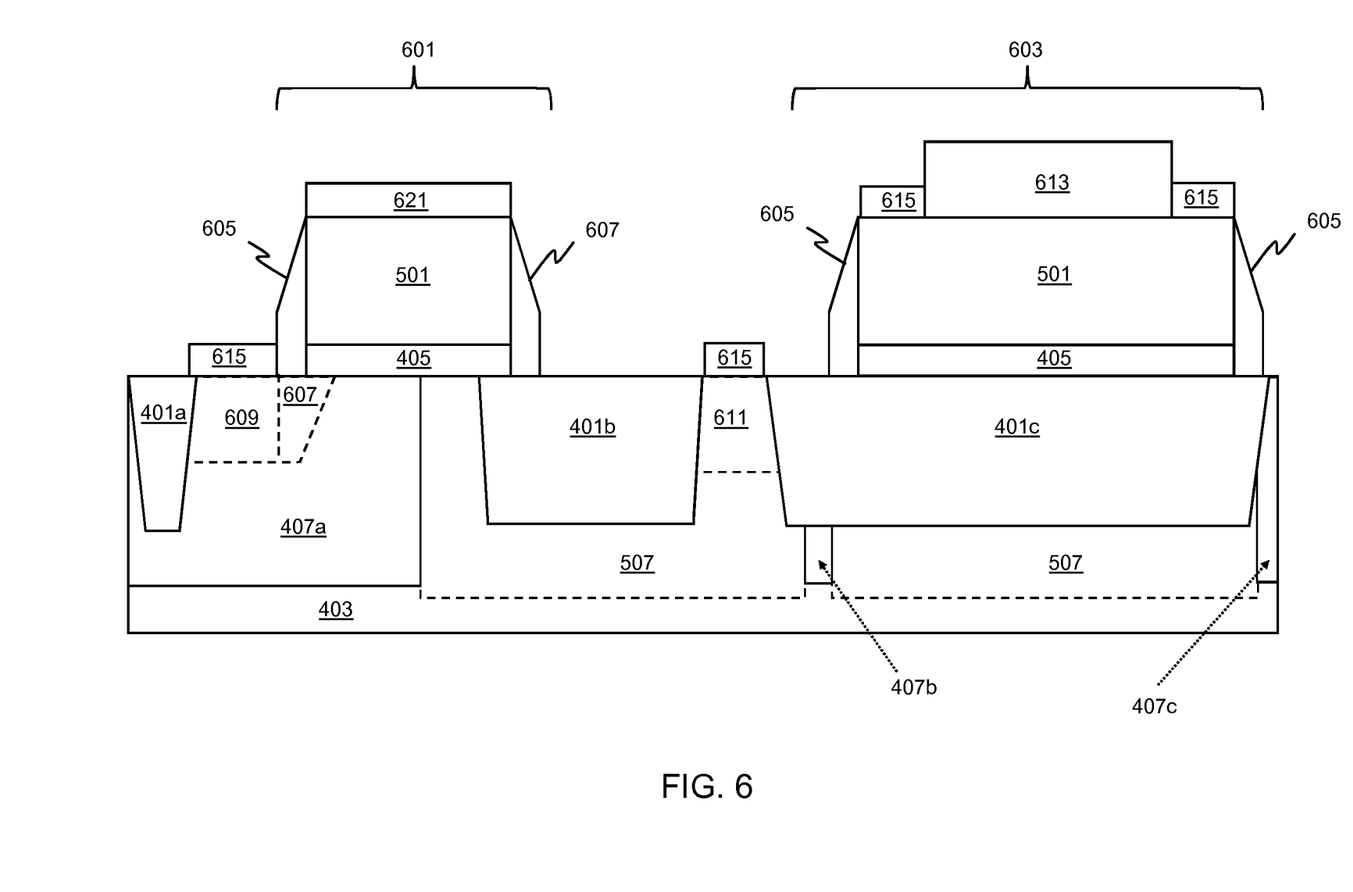

FIGS. 4 through 6 schematically illustrate a process flow for forming an LDNMOS and a high sheet resistance poly resistor, in accordance with an exemplary embodiment of the present disclosure. Similar to FIG. 1, first, second, and third STI regions 401a, 401b, and 401c are first formed in a substrate 403 as illustrated in FIG. 4. Next, first, second, and third P-wells 407a, 407b, and 407c are formed in the substrate 403 using a first mask (not shown for illustrative convenience). A dielectric layer 405, e.g., a gate oxide, is then formed over the substrate 403.

Next, a poly-silicon layer 501 is formed over the dielectric layer 405, as illustrated in FIG. 5. A second mask 503 is then formed over the poly-silicon layer 501 to protect the P-wells 407a, 407b, and 407c. Subsequently, an N-drift implant 505 is performed to form a first N-drift region 507 adjacent to and between the first and second P-wells 407a and 407b, respectively, and a second N-drift region 507 adjacent to and between the second and third P-wells 407b and 407c, respectively. The N-drift implant 505 may include multiple steps, and the energy level is selected to allow the N-drift implant to pass through the poly-silicon. Further, the N-drift implant 505 is performed at an energy level of 300 to 2000 KeV and at a dose of 1e12 to 1e13 ion/cm$^2$, and is optimized for good LDNMOS performance. Thereafter, using the second mask 503, a low energy, high dose, resistance adjustment implant 511 is performed in, but not through, the poly-silicon layer 501. In particular, the resistance adjustment implant 511 is performed at an energy level of 0.5 to 20 KeV and at a dose of 1e14 to 1e15 ion/cm$^2$.

Adverting to FIG. 6, after the resistance adjustment implant 511, the mask 503 is removed. Then, dielectric layer 405 and the poly-silicon layer 501 are patterned to form a gate stack 601 and a poly resistor 603, the poly resistor 603 being formed over the third STI 401c and laterally separated from the gate stack 601. Subsequently, a lightly doped drain region 607 is formed using a third mask (not shown for illustrative convenience). Spacers 605 are then formed on opposite side surfaces of each of the gate stack 601 and the poly resistor 603. Thereafter, first and second n+ regions 609 and 611 are formed using a fourth mask (also not shown for illustrative convenience). The first n+ region 609 is formed in the P-well 407a, adjacent to the first STI region 401a, and the second n+ region 611 is formed in the first N-drift region 507, between the second and third STI regions 401b and 401c. Next, a salicidation block 613 is formed on top of the poly resistor 603, and silicides 615 are then formed over the first and second n+ regions 609 and 611, respectively, the gate stack 601, and on the poly resistor on both sides of the salicidation block 613. Standard BEOL processing may then proceed.

The embodiments of the present disclosure can achieve several technical effects including the use of a single mask to achieve a low $Rds_{on}$ LDNMOS and a high sheet poly resistor. In addition, a single dedicated mask can achieve an optimized LDNMOS by implant of additional N-drain implant and a high sheet resistance poly resistor. The present disclosure enjoys industrial applicability in any of high voltage devices, such as LCD drivers and power management. Embodiments of the present disclosure enjoy utility in various industrial applications as, for example, microprocessors, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming first, second, and third shallow trench isolation (STI) regions in a substrate;
    forming a P-well in the substrate around the first STI region with a first mask;
    forming an N-drift region in the substrate between the P-well and the third STI region with a second mask;
    forming a dielectric layer over the substrate;
    forming a poly-silicon layer over the dielectric layer;
    performing an N-drain implant between the second and third STI regions with a third mask;
    performing a resistance adjustment implant in, but not through, the poly-silicon layer with the third mask; and
    patterning the poly-silicon and dielectric layers subsequent to performing the resistance adjustment implant to form a gate stack and a poly resistor, the poly resistor being formed over the third STI region and laterally separated from the gate stack.

2. The method according to claim 1, comprising performing the N-drain implant at an energy of 300 to 2000 KeV and at a dose of 1e12 to 1e13 ion/cm2.

3. The method according to claim 1, comprising performing the resistance adjustment implant at an energy of 0.5 to 20 KeV and at a dose of 1e14 to 1e15 ion/cm2.

4. The method according to claim 1, wherein the dielectric layer comprises a gate oxide.

5. The method according to claim 1, further comprising:
forming a lightly doped drain (LDD) region using a fourth mask, subsequent to patterning the poly-silicon and dielectric layers.

6. The method according to claim 5, further comprising:
forming spacers on opposite side surfaces of the gate stack and the poly resistor; and
forming first and second n+ regions using a fifth mask in the P-well, adjacent to the first STI region, and in the N-drain implant region between the second and third STI regions, respectively, subsequent to forming the LDD region.

7. The method according to claim 6, further comprising:
forming a salicidation block on top of the poly resistor; and
forming silicide over the first and second n+ regions, the gate stack, and on both sides of the salicidation block on the poly resistor, subsequent to forming the n+ regions.

8. A method comprising:
forming first, second, and third shallow trench isolation (STI) regions in a substrate;
forming first, second, and third P-wells in the substrate with a first mask;
forming a dielectric layer over the substrate;
forming a poly-silicon layer over the dielectric layer;
performing an N-drift implant with a second mask to form first and second N-drift regions adjacent to and between the first and second P-wells and the second and third P-wells, respectively;
performing a resistance adjustment implant with the second mask in, but not through, the poly-silicon layer; and
patterning the poly-silicon and dielectric layers to form a gate stack and a poly resistor, the poly resistor being formed over the third STI region and laterally separated from the gate stack.

9. The method according to claim 8, comprising performing the N-drift implant at an energy of 300 to 2000 KeV and at a dose of 1e12 to 1e13 ion/cm2.

10. The method according to claim 8, comprising performing the resistance adjustment implant at an energy of 0.5 to 20 KeV and at a dose of 1e14 to 1e15 ion/cm2.

11. The method according to claim 8, wherein the dielectric layer comprises a gate oxide.

12. The method according to claim 8, further comprising:
forming a lightly doped drain (LDD) region using a third mask subsequent to patterning the poly-silicon and dielectric layers.

13. The method according to claim 12, further comprising:
forming spacers on opposite side surfaces of the gate stack and the poly resistor; and
forming first and second n+ regions using a fourth mask in the P-well, adjacent to the first STI region, and in the first N-drift between the second and third STI regions, respectively, subsequent to forming the LDD region.

14. The method according to claim 13, comprising:
forming a salicidation block on top of the high sheet resistance poly resistor; and
forming silicide on top of the first and second n+ regions, the gate stack, and on both sides of the salicidation block on the poly resistor, subsequent to forming the n+ regions.

15. A device comprising:
a semiconductor substrate;
first, second, and third shallow trench isolation (STI) regions in the semiconductor substrate;
a P-well, around and adjacent to the first STI;
an N-drift region, between the P-well and the third STI region;
first and second n+ regions;
a gate stack and a poly resistor on the substrate, each having spacers on opposite side surfaces, the gate stack formed between the first and second STI regions and the poly resistor formed over the third STI region;
a salicidation block on top of the poly resistor; and
a silicide formed over the first and second n+ regions, the gate stack, and on the poly resistor at opposite sides of the salicidation block.

16. The device according to claim 15, further comprising an N-drain implant region in the N-drift region between the second and third STI regions.

17. The device according to claim 15, further comprising second and third P-wells below the third STI region, at opposite sides of the third STI region.

18. The device according to claim 17, further comprising a second N-drift region between the second and third P-wells.

19. The device according to claim 15, wherein the gate stack and the poly resistor each comprise a poly-silicon layer over a gate oxide layer.

20. The method according to claim 19, wherein the poly resistor comprises a dopant implanted at an energy of 0.5 to 20 KeV and at a dose of 1e14 to 1e15 ion/cm2.

* * * * *